United States Patent
Stein et al.

(10) Patent No.: US 7,696,078 B2
(45) Date of Patent: Apr. 13, 2010

(54) METHOD FOR PRODUCING AN ELECTRICAL CONTACT FOR AN OPTOELECTRONIC SEMICONDUCTOR CHIP

(75) Inventors: Wilhelm Stein, Liudau (DE); Michael Fehrer, Bad Abbach (DE); Johannes Baur, Laaber (DE); Matthias Winter, Regensburg (DE); Andreas Ploessl, Regensburg (DE); Stephan Kaiser, Regensburg (DE); Berthold Hahn, Hemau (DE); Franz Eberhard, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 168 days.

(21) Appl. No.: 11/654,224

(22) Filed: Jan. 16, 2007

(65) Prior Publication Data

US 2007/0117235 A1    May 24, 2007

Related U.S. Application Data

(62) Division of application No. 10/789,199, filed on Feb. 26, 2004, now Pat. No. 7,164,158.

(30) Foreign Application Priority Data

Feb. 26, 2003 (DE) ................. 103 08 325
Oct. 30, 2003 (DE) ................. 103 50 707

(51) Int. Cl.
*H01L 21/44* (2006.01)

(52) U.S. Cl. .............. 438/597; 438/571; 438/666; 257/E29.124

(58) Field of Classification Search ............ 438/571, 438/597, 666
See application file for complete search history.

(56) References Cited

U.S. PATENT DOCUMENTS

| 4,210,389 | A | 7/1980 | Burkhart et al. |
| 5,990,500 | A * | 11/1999 | Okazaki ............... 257/99 |
| 6,228,456 | B1 | 5/2001 | Butterbach et al. |
| 6,291,840 | B1 | 9/2001 | Uemura et al. |
| 6,791,119 | B2 | 9/2004 | Slater, Jr. et al. |
| 6,806,544 | B2 | 10/2004 | Liu |
| 2002/0014630 | A1* | 2/2002 | Okazaki et al. ........... 257/79 |
| 2002/0123164 | A1* | 9/2002 | Slater et al. ............ 438/39 |
| 2003/0015721 | A1* | 1/2003 | Slater et al. ............ 257/99 |
| 2003/0107137 | A1 | 6/2003 | Stierman et al. |
| 2003/0197170 | A1 | 10/2003 | Bader et al. |

FOREIGN PATENT DOCUMENTS

| DE | 19921987 A1 | 11/1999 |
| EP | 0926744 A2 | 12/1998 |
| EP | 1168460 A2 | 6/2001 |
| EP | 1179836 A2 | 8/2001 |
| JP | 11220171 A | 8/1999 |
| WO | WO 01/47039 A1 | 6/2001 |
| WO | WO 02/19439 | 3/2002 |
| WO | WO 02/19493 A1 | 3/2002 |

* cited by examiner

*Primary Examiner*—Wai-Sing Louie
(74) *Attorney, Agent, or Firm*—Cohen Pontant Lieberman & Pavane LLP

(57) ABSTRACT

A method for producing an electrical contact of an optoelectronic semiconductor chip (1), comprising providing a mirror layer (2), comprised of a metal or metal alloy, over the semiconductor chip; providing a protective layer (3) over said mirror layer; providing a layer sequence of a barrier layer and a coupling layer (5) over said protective layer; and providing a solder layer (8) over said layer sequence.

14 Claims, 2 Drawing Sheets

METHOD FOR PRODUCING AN ELECTRICAL CONTACT FOR AN OPTOELECTRONIC SEMICONDUCTOR CHIP

RELATED APPLICATIONS

This is a divisional of application Ser. No. 10/789,199 filed Feb. 26, 2004 now U.S. Pat. No. 7,164,158. This application claims the priority of German patent applications 10308325.1 filed Feb. 26, 2003 and 10350707.8 filed Oct. 30, 2003, the disclosures of which are hereby incorporated by reference.

FIELD OF THE INVENTION

The invention relates to a method for producing an electrical contact for an optoelectronic semiconductor chip.

BACKGROUND OF THE INVENTION

In modern production methods for light-emitting diodes (LEDs), the light-emitting layer sequence is often first grown on a growth substrate, subsequently applied to a new carrier, and then the growth substrate is detached. This method has on the one hand the advantage that growth substrates, in particular growth substrates suitable for the production of nitride compound semiconductors, which are comparatively expensive, can be reused. Such a device is known for example from U.S. patent application Ser. No. 10/377,363. This method, referred to as thin-film technology, also has the advantage that the detachment of the original substrate allows the disadvantages of the latter, such as for example a low electrical conductivity and increased absorption of the radiation generated or detected by the optoelectronic device, to be avoided. As a result, the efficiency of LEDs, in particular the brightness, can be increased.

A further technology for the production of highly efficient LEDs is so-called flip-chip technology. Such a device is disclosed for example in U.S. Pat. No. 6,514,782. Described therein is a radiation-emitting semiconductor chip which is connected to a carrier substrate both by the n contact and by the p contact by means of a direct soldered connection.

Both in thin-film technology and in flip-chip technology, it is advantageous to form the contact between the semiconductor chip and the carrier substrate as a reflecting contact. In this way, penetration of the radiation generated or detected by an optoelectronic device into the contact is avoided and consequently the absorption losses are reduced.

Such a reflecting electrical contact is disclosed for example in U.S. Pat. No. 6,194,743. In this document, a silver layer is specified as a suitable ohmic contact for a p-type GaN semiconductor. However, mention is also made of the low adhesive strength and corrosion resistance of silver layers on nitride compound semiconductors.

SUMMARY OF THE INVENTION

One object of the invention is to provide an improved electrical contact.

Another object of the invention is to provide an electrical contact having high reflectivity, good ohmic contact with respect to a semiconductor, good adhesion on the semiconductor and good adhesion of the layers forming the contact with one another, good thermal stability, high stability with respect to environmental influences, and also solderability and patternability.

A further object of the invention is to provide a method for producing such a contact.

These and other objects are attained in accordance with one aspect of the invention directed to a method for producing an electrical contact of an optoelectronic semiconductor chip, comprising providing a mirror layer, comprised of a metal or metal alloy, over the semiconductor chip, providing a protective layer over said mirror layer, providing a layer sequence of a barrier layer and a coupling layer over said protective layer, and providing a solder layer over said layer sequence.

DETAILED DESCRIPTION OF THE DRAWINGS

Figure 1:
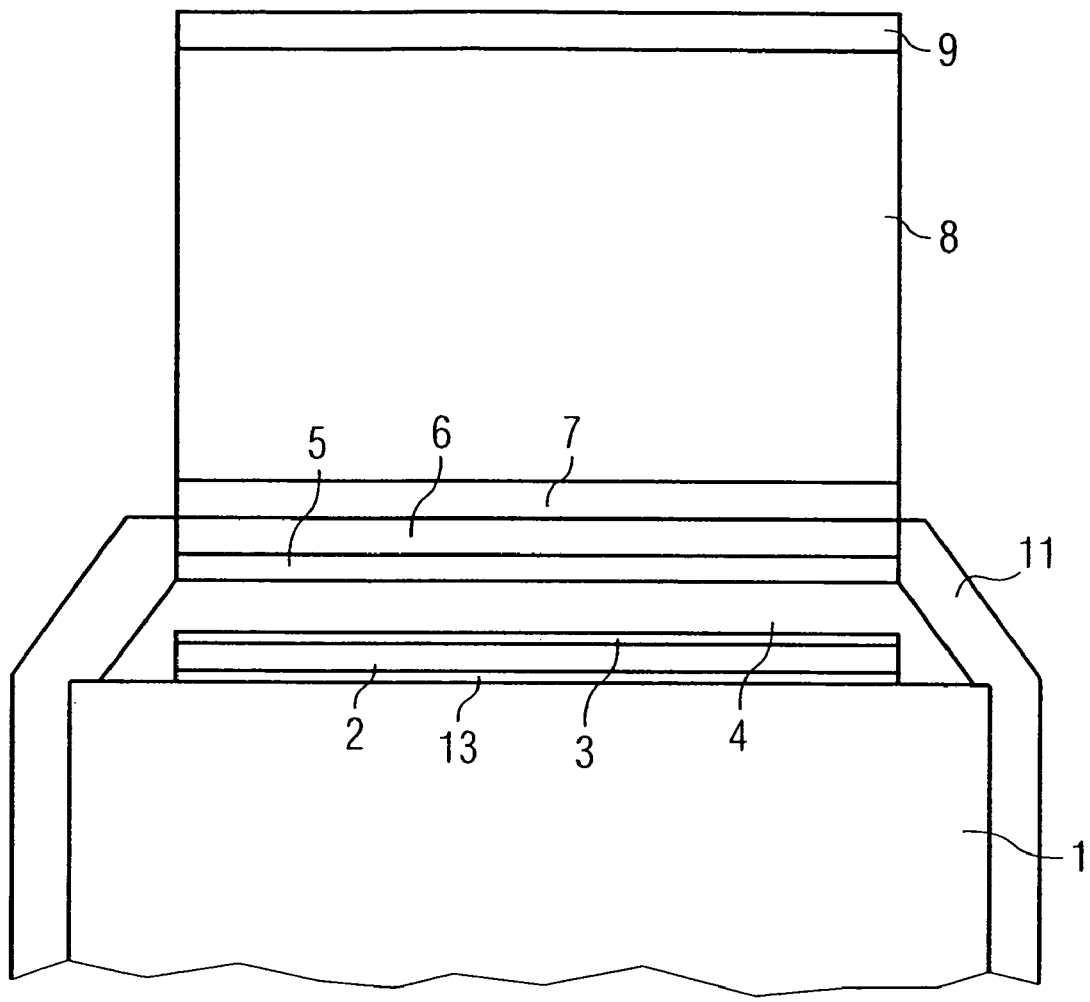
FIG. 1 shows a schematic cross section through an electrical contact produced in accordance with an embodiment of the invention.

FIG. 1 shows a semiconductor chip 1, to which an electrical contact produced according to an embodiment of the invention has been applied. The semiconductor chip may have on its surface, for example, a material from the group of nitride compound semiconductors, a nitride compound semiconductor being understood as meaning a nitride compound of elements of the third and/or fifth main group, in particular GaN, AlGaN, InGaN, AlInGaN, AlN or InN.

A mirror layer 2 has been applied to the semiconductor chip 1. The mirror layer contains a metal or a metal alloy, preferably one of the following metals: silver, aluminum or platinum. The mirror layer 2 is preferably between 70 nm and 130 nm thick. The mirror layer 2 reflects the radiation that is incident from the direction of the optoelectronic semiconductor chip 1 and thereby prevents the absorption of this radiation in the electrical contact. Apart from this advantageous optical property, the mirror layer also establishes an ohmic contact with respect to the semiconductor. For example, a Pt/Al combination may be used for establishing an ohmic contact on an InGaN semiconductor. On p-GaN semiconductor material, a silver layer is suitable for establishing an ohmic contact.

Furthermore, a protective layer 3 has been applied to the mirror layer 2, in order to protect it from corrosion in further process steps. The protective layer 3 is preferably a titanium or platinum layer between 5 nm and 15 nm thick. In the case of wet-chemical patterning of the mirror layer 2, titanium is preferably used as the material for the protective layer 3, since the etching of platinum is technically very difficult.

An improvement of the adhesion of the mirror layer 2 on the semiconductor chip 1 can be achieved by an annealing step. For example, a mirror layer 2 of silver is annealed for approximately 5 minutes at 300° C. In the case of wet-chemical patterning of the mirror layer 2, this annealing step can be carried out directly after the coating.

A further possibility for improving the adhesion of the mirror layer 2 is to apply a layer 13 of an electrically conductive material between 0.1 nm and 0.5 nm thin to the semiconductor chip 1 before the application of the mirror layer 2. This thin layer 13 may be deposited over the surface area or in the form of islands. The thin layer 13 preferably contains Pt, Pd or Ni. It is particularly advantageous to use these materials on a surface of a semiconductor chip 1 having a nitride compound semiconductor material and when a mirror layer 2 which contains Ag or Al is used.

A barrier layer 4 has been applied to the protective layer 3. The barrier layer 4 preferably contains TiW(N) and is approximately 300 nm to 500 nm thick. By patterning the barrier layer 4 by means of the lift-off technique, which is described in still more detail below, a complete coverage of the mirror layer 2 and of the protective layer 3 with the barrier layer 4 can be achieved. The patterning of the following layers can also take place by means of this lift-off technique. One advantage of this type of patterning is the low thermal loading of the system of layers.

A coupling layer 5, which ensures good adhesion of the layers that follow, has been applied to the barrier layer 4. The coupling layer 5 is preferably a titanium layer between 30 nm and 70 nm thick. It should be understood that the position of the coupling layer and the barrier layer in the layer sequence may be interchanged.

A wetting layer 6, which brings about uniform wetting of the contact area with the solder during the later soldering operation, has preferably been applied to said coupling layer. The wetting layer 6 is preferably a platinum layer between 70 nm and 130 nm thick.

A solder layer 8, which may be either a hard solder, such as for example AuSn, or a soft solder, such as for example Sn, has been applied to the wetting layer 6. The solder layer 8 has been applied for example by means of the PVD technique or by means of electro-deposition. Patterning of the solder layer 8 is possible by means of the lift-off technique described above or by means of wet-chemical patterning.

The solder layer 8 may optionally be covered with a gold layer 9, which is preferably between 30 nm and 70 nm thick.

Advantageously inserted between the wetting layer 6 and the solder layer 8 is a gold layer 7, which protects the system of layers lying under it from corrosion before the application of the solder layer 8. This is advisable in particular whenever a mask layer applied for the patterning of the system of layers produced up to this time is removed before the application of the solder layer. The preferred thickness of such a gold layer 7 when an Sn solder is used is approximately 70-130 nm, when an AuSn solder is used approximately 400 nm to 800 nm. The function of the wetting layer 6 is retained in spite of this intermediate layer, since the gold layer 7 melts during the later soldering operation.

In the soldering operation it is possible, but undesired, for the solder to reach the side flanks of the semiconductor chip. In order in this case to prevent a short-circuit of the solder with the semiconductor layers ending at the side flanks of the semiconductor chip, the side flanks may be provided with a passivation 11, for example of silicon dioxide or silicon nitride.

A contact of this type is suitable in particular for use in flip-chip technology and thin-film technology. A thin-film semiconductor body is to be understood for the purposes of the invention as meaning a semiconductor body which is epitaxially grown on an epitaxial substrate and from which the epitaxial substrate has been detached.

The thin-film semiconductor body is for example connected by the electrical contact to a carrier body (not shown, but which would be located above the solder layer). The materials of the solder layer 8 and of the carrier body are preferably made to match each other in such a way that they can form an alloy, in particular a eutectic alloy, that is to say no metallurgical barrier exists between the solder layer 8 and the carrier body. The material of the carrier body can begin to melt during the soldering operation and consequently serve as a material reservoir for the forming of a eutectic alloy. Furthermore, incipient melting of the carrier body at the soldering location may advantageously have the effect that any particles possibly occurring during the soldering operation can melt into the carrier. As a result, the intercalation of particles between the carrier body and the semiconductor chip 1, which could increase the distance between the carrier and the semiconductor chip, is reduced. The forming of voids is also likewise reduced.

The combination of a solder layer 8 of AuGe with a Ge carrier or the combination of an AuSi solder layer 8 with a Si carrier is particularly advantageous. A Ge carrier is suitable in particular for the production of thin-film LEDs, in the case of which a growth substrate of sapphire is detached by means of a laser lift-off method, since germanium has a similar coefficient of expansion to sapphire and therefore mechanical stresses are reduced by the heat produced in the detachment process.

The eutectic temperatures which have to be achieved or exceeded in the soldering operation are for AuGe approximately 361° C. and for AuSi approximately 363° C. When such solders are used, the system of layers of the contact must be stable at the soldering temperature. On account of the required thermal stability, the thin layer 13 which is inserted between the semiconductor chip 1 and the mirror layer 2 to improve the adhesion of the mirror layer 2 preferably contains palladium or a nickel oxide. A contact with a thin layer 13 of one of these materials is also relatively insensitive to hydrogen-containing contaminants, which may be integrated into the system of layers during the epitaxy.

Suitable for example for the patterning of an electrical contact according to the invention are known methods of wet-chemical patterning, which are not to be explained in any more detail here. The so-called lift-off technique (lift-off method) is preferably used for the invention. The method steps in the lift-off technique are explained in more detail below by way of example on the basis of the patterning of the mirror layer 2 in conjunction with FIGS. 2a to 2e.

Figure 2A:
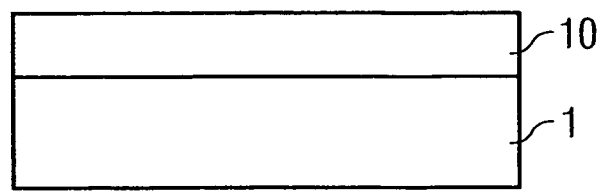
FIGS. 2A-2E show schematically represented intermediate stages to explain the patterning by means of the lift-off technique.

As represented in FIG. 2a, a mask layer 10 of a photoresist is first applied to the semiconductor chip 1.

Figure 2B:
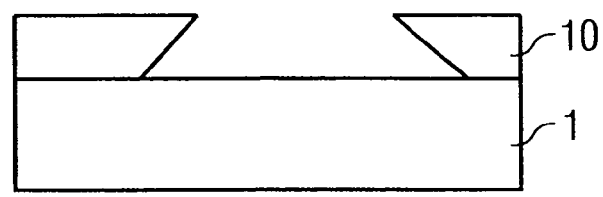

By means of suitable exposure, developing and etching, a window is produced in the mask layer 10, having a strong undercut as represented in FIG. 2b. The undercut may be formed for example by underetching with a suitable etchant. As a result, the mask layer has a narrower cross section on the side remote from the semiconductor chip than on the surface of the semiconductor chip. The flanks of the mask layer facing the window preferably form an angle of less than 75° with the surface of the semiconductor chip 1. Since the conditions for producing such a window are known to a person skilled in the art, they are not explained in any more detail at this point.

Figure 2C:
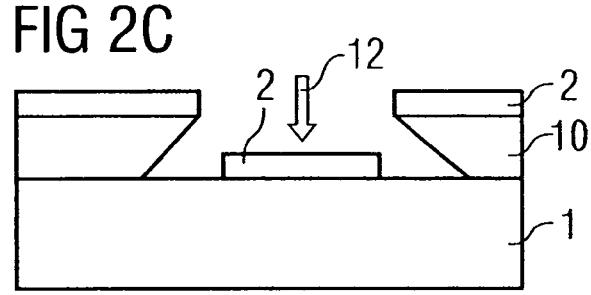

Subsequently, the mirror layer 2 is applied to the semiconductor chip by a directed coating technique, for example by vapor deposition. The depositing of the mirror layer 2 takes place substantially only onto the region of the semiconductor chip 1 that is not shadowed by the mask layer 10 in the vapor-depositing direction 12, while the regions of the semiconductor chip 1 lying under the undercut of the window are shadowed and, as represented in FIG. 2c, are not covered by the mirror layer 2. In the same way, further layers, for example a protective layer 3 for the mirror layer 2, can then be applied to the semiconductor chip 1 (not represented).

Figure 2D:
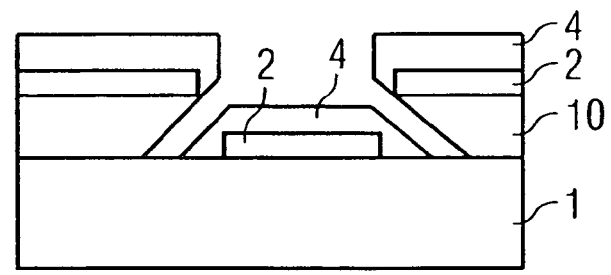

In the process step which follows, a further layer, which may for example be a barrier layer 4, is applied to the semiconductor chip 1, as represented in FIG. 2d, by an undirected coating method, for example by means of sputtering. The use of an undirected coating method has the effect that the regions of the semiconductor chip 1 lying under the undercut of the window are also covered with the applied layer, and consequently complete coverage of the previously applied layer or layers, for example of the mirror layer 2, is achieved.

Figure 2E:
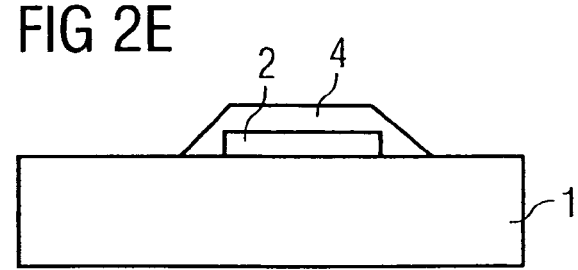

After the detachment of the mask layer 10, the semiconductor chip 1 is covered with a patterned layer, for example the mirror layer 2, and a further layer, covering this layer, for example the barrier layer 4, as shown in FIG. 2e.

A lift-off technique is generally to be understood for the purposes of the invention as meaning the application or formation of a mask layer, the application of one or more layers and subsequent detachment of the mask layer. The mask layer is preferably provided with an undercut, a first layer is deposited in a directed manner, and a second layer is deposited in an undirected manner for the complete coverage of the first layer, complete coverage being understood as meaning covering of the surface and the side flanks.

The extent of protection of the invention is not restricted by the description of the invention on the basis of the exemplary embodiments. Rather, the invention comprises every novel feature and every combination of features, which in particular includes every combination of features in the patent claims, even when this combination is not explicitly specified in the patent claims.

The invention claimed is:

1. A method for producing an electrical contact of an optoelectronic semiconductor chip, the method comprising:
   providing a mirror layer comprised of a metal or metal alloy, over the semiconductor chip;
   providing a protective layer over said mirror layer;
   providing a layer sequence of a barrier layer and a coupling layer over said protective layer; and
   providing a solder layer over said layer sequence,
   wherein the electrical contact is patterned by a lift-off technique in which a mask layer having an undercut is applied to the semiconductor chip, the mirror layer is vapor-deposited in a directed manner, and the barrier layer is applied by a multiple directions covering coating method so that the barrier layer completely covers layers underneath.

2. The method for producing an electrical contact as claimed in claim 1, further comprising applying a layer of an electrically conductive material having a thickness between 0.1 and 0.5 nm to the semiconductor chip before the application of the mirror layer to improve the adhesion of the mirror layer.

3. The method for producing an electrical contact as claimed in claim 2, wherein the semiconductor chip has a surface formed of a nitride compound semiconductor material, the mirror layer contains Al or Ag, and the layer of electrically conductive material contains Pt, Pd or Ni.

4. The method for producing an electrical contact as claimed in claim 1, wherein said mirror layer is comprised of silver, and the method further comprises annealing the semiconductor chip at approximately 300° C. to improve adhesion of said mirror layer to the semiconductor chip.

5. The method for producing an electrical contact as claimed in claim 1, wherein providing said layer sequence comprises providing said barrier layer over said protective layer, and providing said coupling layer over said barrier layer.

6. The method for producing an electrical contact as claimed in claim 1, wherein the semiconductor chip has a surface formed of a nitride compound semiconductor material.

7. The method for producing an electrical contact as claimed in claim 1, wherein the mirror layer contains Al.

8. The method for producing an electrical contact as claimed in claim 1, wherein the mirror layer contains Ag.

9. The method for producing an electrical contact as claimed in claim 2, wherein the layer of electrically conductive material contains Pt, Pd or Ni.

10. The method for producing an electrical contact as claimed in claim 2, wherein the layer of electrically conductive material contains Pt.

11. The method for producing an electrical contact as claimed in claim 2, wherein the layer of electrically conductive material contains Pd.

12. The method for producing an electrical contact as claimed in claim 2, wherein the layer of electrically conductive material contains Ni.

13. The method for producing an electrical contact as claimed in claim 1, wherein said mirror layer is comprised of silver.

14. The method for producing an electrical contact as claimed in claim 1, further comprising annealing the semiconductor chip at approximately 300° C.

* * * * *